United States Patent
Wen et al.

(10) Patent No.: US 6,895,484 B2
(45) Date of Patent: May 17, 2005

(54) RECEIVER FOR A MEMORY CONTROLLER AND METHOD THEREOF

(75) Inventors: Chih-Chiang Wen, Hsinchu Hsien (TW); Ming-Hsien Lee, Hsinchu (TW); Tsan Hui Chen, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 287 days.

(21) Appl. No.: 10/352,879

(22) Filed: Jan. 29, 2003

(65) Prior Publication Data

US 2003/0149853 A1 Aug. 7, 2003

(30) Foreign Application Priority Data

Feb. 1, 2002 (TW) ....................................... 91101772 A

(51) Int. Cl.[7] ............................................. G06F 12/06
(52) U.S. Cl. ..................................................... 711/167
(58) Field of Search ................................ 711/605, 167, 711/218; 385/230.03

(56) References Cited

U.S. PATENT DOCUMENTS 6,272,065 B1 * 8/2001 Kim ........................... 365/233
6,625,702 B2 * 9/2003 Rentschler et al. ......... 711/154
6,629,222 B1 * 9/2003 Jeddeloh ..................... 711/167
6,675,272 B2 * 1/2004 Ware et al. ................. 711/167

* cited by examiner

Primary Examiner—Kevin L. Ellis
(74) Attorney, Agent, or Firm—Birch, Stewart, Kolasch & Birch, LLP

(57) ABSTRACT

A receiver for a memory controller. The memory controller sends a data request signal to a memory which responds to the data request signal by sending data and a data strobe signal back to the memory controller. The receiver comprises a delay circuit receiving and delaying the data strobe signal, an emulated data strobe signal generator receiving the data request signal to generate an emulated data strobe signal, a push pointer generator generating a plurality of push pointers having priorities, receiving and responding to the emulated data strobe signal by outputting the push pointers in an order according to the priorities, and a buffer receiving and responding to the delayed data strobe signal and the push pointers by storing the data in memory addresses corresponding to the push pointers.

6 Claims, 6 Drawing Sheets

RECEIVER FOR A MEMORY CONTROLLER AND METHOD THEREOF

BACKGROUND OF THE INVENTION

1. Field of the Invention

The present invention relates to a receiver for a memory controller and the method thereof, particularly to a receiver for a memory controller, which substitutes a memory's data strobe signal for a self-generated emulated data strobe signal to avoid malfunction caused by noise resulting from transmission of the data strobe signal.

2. Description of the Prior Art

Dominated mainly by the data transfer rate, performance of SDRAM doubly increases when Single Data Rate (SDR) migrates to Double Data Rate (DDR) SDRAM, in which data are transferred on both edges of the SDRAM clock. Accompanied with the data transferred in DDR SDRAM systems, a data strobe signal is also transmitted for synchronization.

FIG. 1 is a diagram showing a conventional receiver for a memory controller. The receiver 1 comprises a push pointer strobe signal generator 101 composed of a Schmitt trigger 11 and delay circuit 13a, a data strobe signal delay circuit 102 composed of a one-ended differential buffer 12 and delay circuit 13b, a first and second push pointer generator 14a and 14b, buffers 15a and 15b, and data collector 16. The push pointer strobe signal generator 101 outputs a signal Push-PTR DQS to the first and second push pointer generator 14a and 14b. The data strobe signal delay circuit 102 outputs a delayed data strobe signal Delayed DQS to the buffers 15a and 15b.

The operation of the conventional receiver 1 will be explained in the following. A memory (not shown) sends data and a data strobe signal READ_DQS to the memory controller when the memory controller sends a data request signal to request the data from the memory. The push pointer strobe signal generator 101 and the data strobe signal delay circuit 102 of the receiver 1 receive the data strobe signal READ_DQS from the memory and generate signals Push-PTR DQS and Delayed DQS. The push pointer generator 14a and 14b generate push pointers PTR1 and PTR2 having priorities, receive and respond to the signal Push-PTR DQS by outputting to the buffers 15a and 15b the push pointers PTR1 and PTR2 in an order according to the priorities upon the rising and falling edges of the signal Push-PTR DQS. The buffers 15a and 15b receive and respond to the signal Delayed DQS and the push pointers PTR1 and PTR2 by alternatively storing the data in memory addresses corresponding to the push pointers PTR1 and PTR2 upon rising and falling edges of the signal Delayed DQS. The data collector 16 collects the data stored in the buffers 15a and 15b.

However, in the previously described receiver, noise in the data strobe signal READ_DQS resulting from the transmission between the memory and the controller easily causes malfunction of the receiver. FIG. 2 is a diagram showing the waveforms of the signals Push-PTR DQS, Data and PTR1. The noisy signal READ_DQS results in noise in the signal Push-PTR DQS. An unintended rising edge appears in the signal Push-PTR DQS and causes wrong push pointer PTR1 and PTR2 from the push pointer generators 14a and 14b when the noise is too large. This results in wrong storage od the data in the buffers 15a and 15b.

SUMMARY OF THE INVENTION

Therefore, the object of the present invention is to provide a receiver for a memory controller, which substitutes a memory's data strobe signal for a self-generated emulated data strobe signal to avoid malfunction caused by noise resulting from transmission of the data strobe signal.

The present invention provides a receiver for a memory controller. The memory controller sends a data request signal to a memory which responds to the data request signal by sending data and a data strobe signal back to the memory controller. The receiver comprises a delay circuit receiving and delaying the data strobe signal, an emulated data strobe signal generator receiving the data request signal to generate an emulated data strobe signal, a push pointer generator generating a plurality of push pointers having priorities, receiving and responding to the emulated data strobe signal by outputting the push pointers in an order according to the priorities, and a buffer receiving and responding to the delayed data strobe signal and the push pointers by storing the data in memory addresses corresponding to the push pointers.

The present invention further provides a method for data receipt by a memory controller. The memory controller sends a data request signal to a memory which responds to the data request signal by sending data and a data strobe signal back to the memory controller. The method comprises the steps of receiving and delaying the data strobe signal, receiving the data request signal to generate an emulated data strobe signal, generating a plurality of push pointers having priorities, receiving and responding to the emulated data strobe signal by outputting the push pointers in an order according to the priorities, and receiving and responding to the delayed data strobe signal and the push pointers by storing the data in memory addresses corresponding to the push pointers.

Thus, the malfunction resulting from the transmission noise of the data strobe signal is avoided by using the self-generated emulated data strobe signal.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
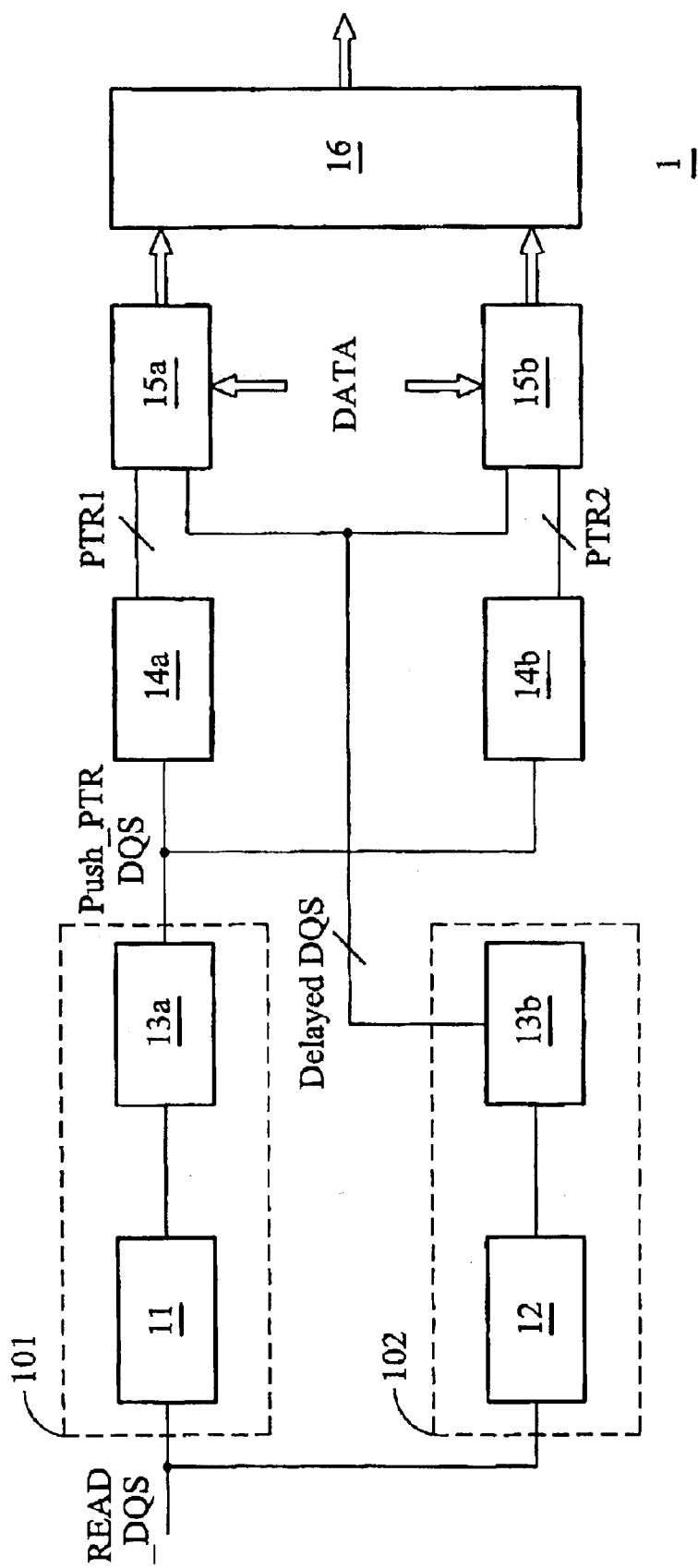
FIG. 1 is a diagram showing a conventional receiver for a memory controller.
Figure 2:
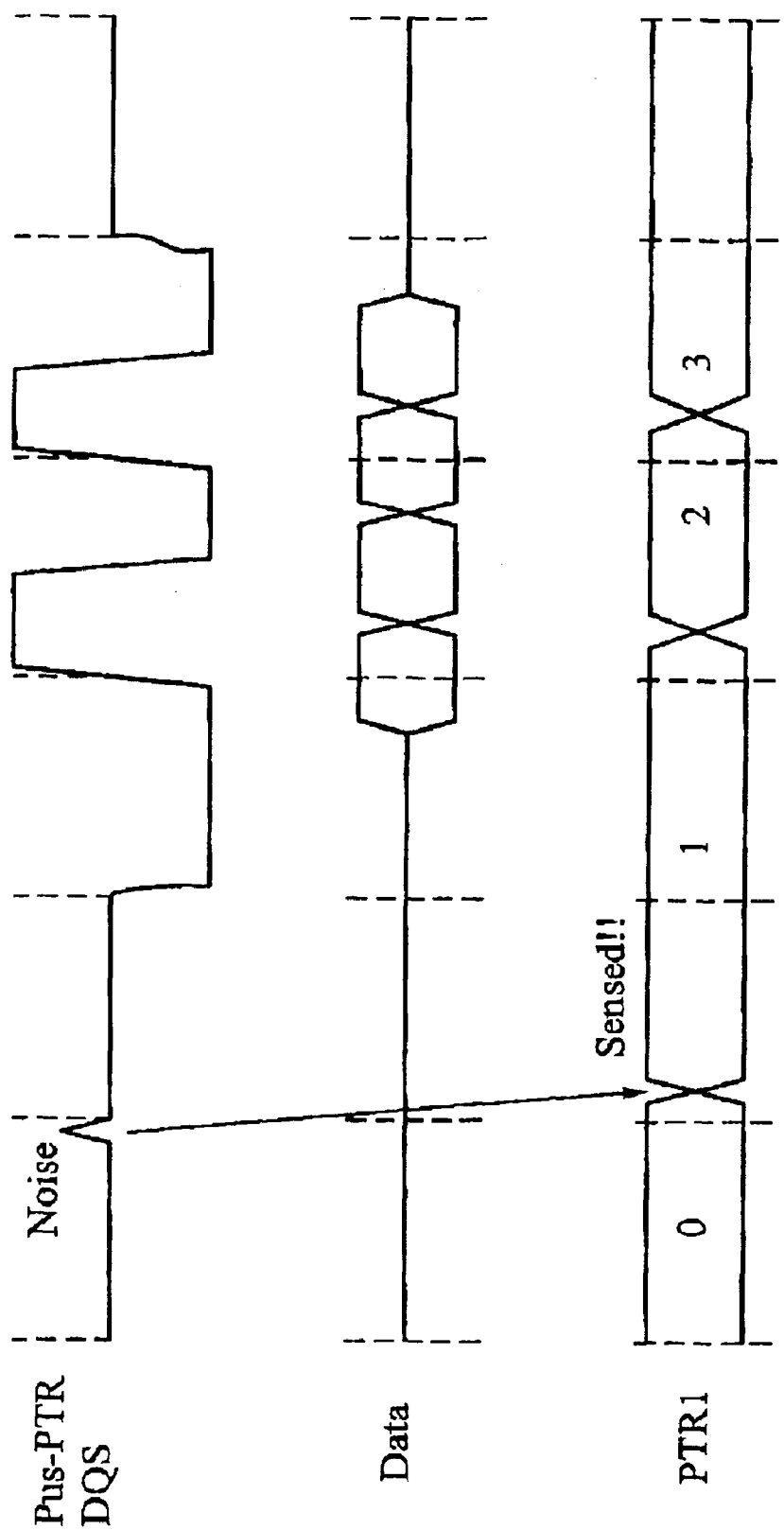
FIG. 2 is a diagram showing waveforms of the signals Push-PTR DQS, Data and PTR1.
Figure 3:
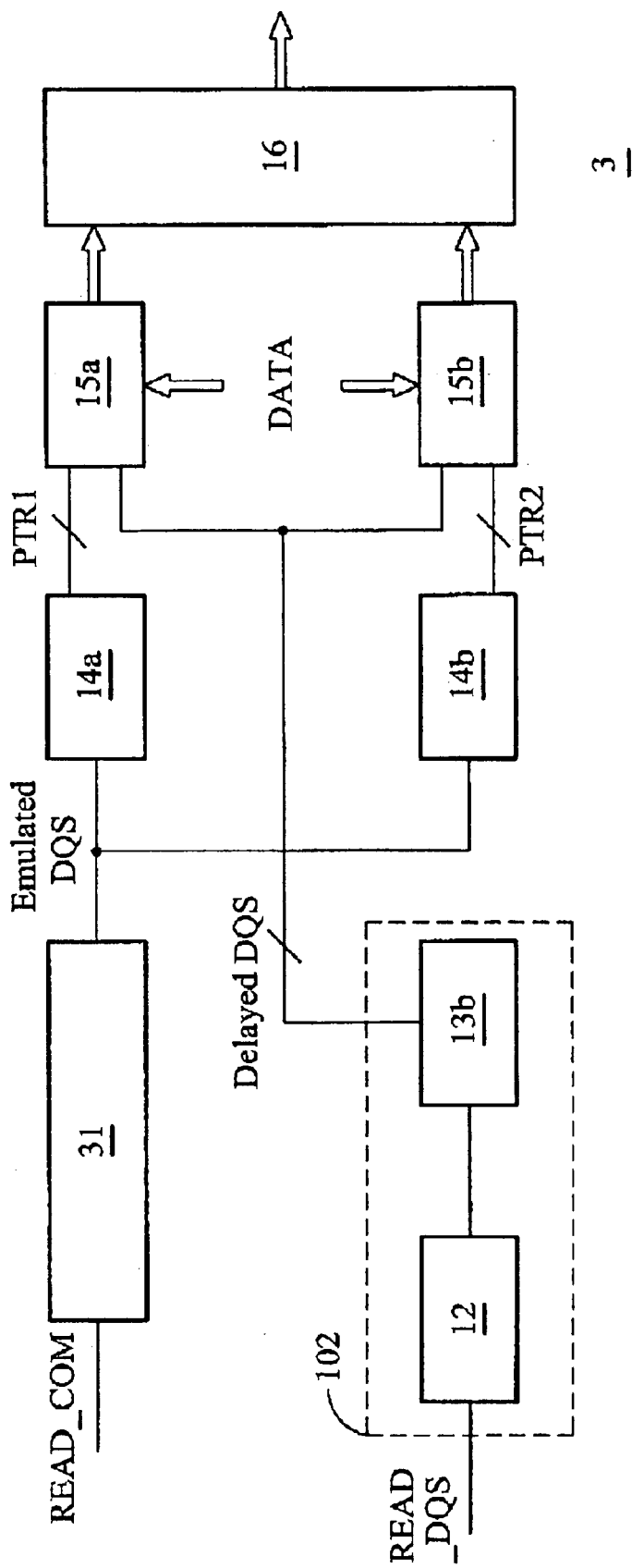
FIG. 3 is a diagram showing a receiver for a memory controller according to one embodiment of the invention.

FIG. 3 is a diagram showing a receiver for a memory controller according to one embodiment of the invention. The same elements in FIG. 1 and FIG. 2 refer to the same symbol. The receiver 3 comprises an emulated data strobe signal generator 31, a data strobe signal delay circuit 102 composed of a one-ended differential buffer 12 and delay circuit 13b, a first and second push pointer generator 14a and 14b, buffers 15a and 15b, and data collector 16. The emulated data strobe signal generator 31 outputs an emulated data strobe signal Emulated DQS to the first and second push pointer generator 14a and 14b. The data strobe signal delay circuit 102 outputs a delayed data strobe signal Delayed DQS to the buffers 15a and 15b.

The operation of the conventional receiver 3 will be explained in the following. A memory (not shown) sends data and a data strobe signal READ_DQS to the memory controller when the memory controller sends a data request signal to request the data from the memory. The data strobe signal delay circuit 102 of the receiver 1 receives the data strobe signal READ_DQS from the memory and the emulated data strobe signal generator 31 receives a read command signal READ_COM. The data strobe signal delay circuit 102 and the emulated data strobe signal generator 31 generate signals Delayed DQS and Emulated DQS respectively. The push pointer generator 14a and 14b generate push pointers PTR1 and PTR2 having priorities, receive and respond to the signal Emulated DQS by outputting to the buffers 15a and 15b the push pointers PTR1 and PTR2 in an order according to the priorities upon rising and falling edges of the signal Emulated DQS. The buffers 15a and 15b receive and respond to the signal Delayed DQS and the push pointers PTR1 and PTR2 by alternatively storing the data in memory addresses corresponding to the push pointers PTR1 and PTR2 upon rising and falling edges of the signal Delayed DQS. The data collector 16 collects the data stored in the buffers 15a and 15b.

Figure 4:
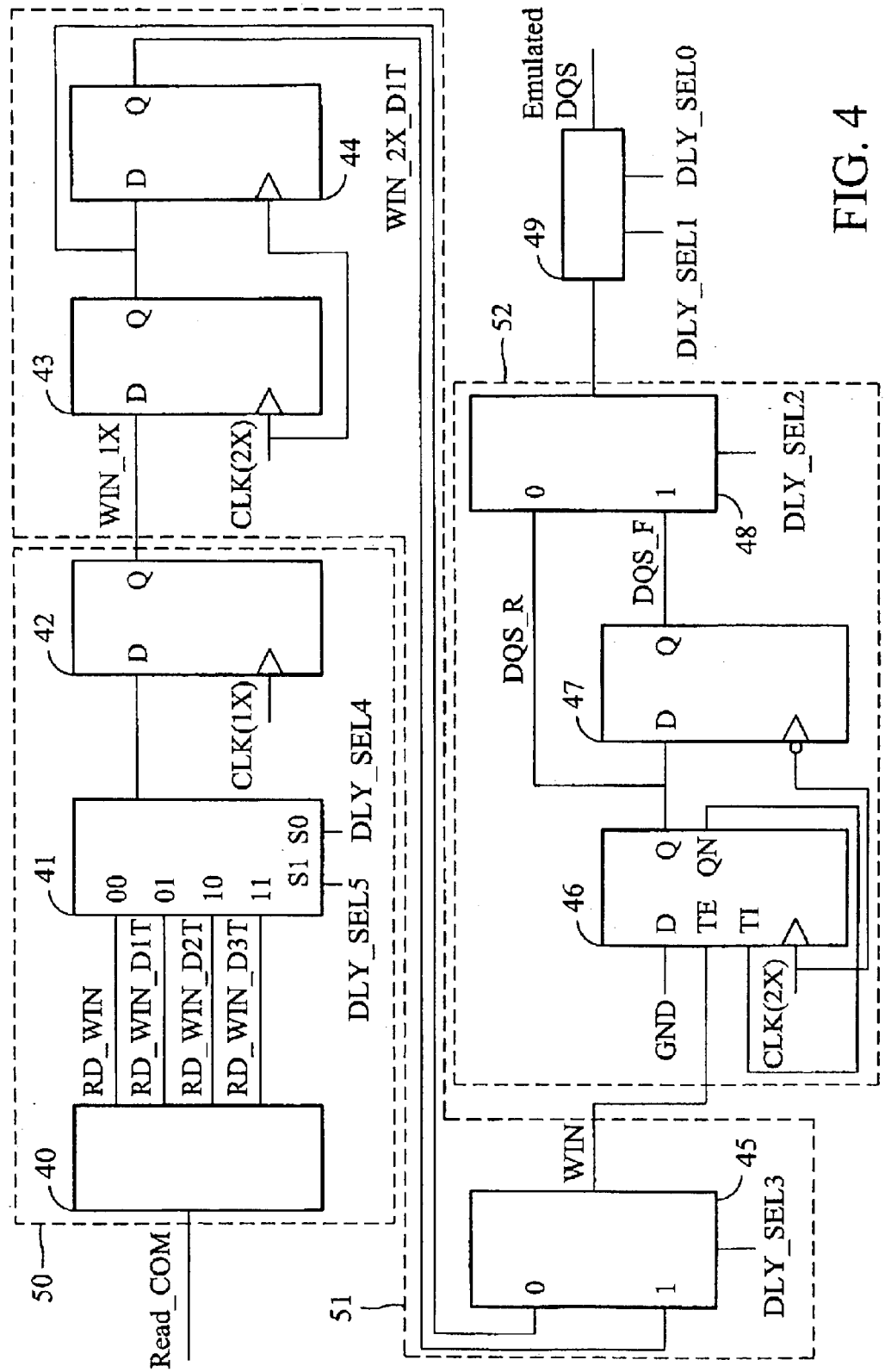
FIG. 4 is a diagram showing an emulated data strobe signal generator according to one embodiment of the invention.

FIG. 4 is a diagram showing an emulated data strobe signal generator according to one embodiment of the invention. The emulated data strobe signal generator 31 comprises a first coarse shifter 50, a second coarse shifter 51, a semi data strobe signal generator 52 and a fine shifter 49.

The first coarse shifter 50 shifts or delays received signals by resolution of a clock period. It comprises a read window signal generator 40, a multiplexer 41 and a D flip-flop 42. The read window signal generator 40 receives the read command signal READ_COM and generates read window signals RD_WIN, RD_WIN_D1T, RD_WIN_D2T and RD_WIN_D3T, each of which has a pulse with a duration equal to a read time of the data. The four read window signals have different delay times which are 0, one, two and three clock periods. One of them is transferred to the D flip-flop 42 by the multiplexer 41 according to the selection signals DLY_SEL5 and DLY_SEL4. Thus, a read window signal with proper delay time is output to the second coarse shifter 51.

The second coarse shifter 51 shifts or delays received signals by halves of 1× clock period. It comprises D flip-flop 43, 44 and a multiplexer 45. The D flip-flop 43 and 44 receives a clock signal CLK(2×) with double clock frequency. One of the signal WIN_2×_DIT and WIN_2× is transferred to the semi data strobe signal generator 52 by the multiplexer 45 according to the selection signals DLY_SEL3.

The semi data strobe signal generator 52 receives the signal WIN and generates a semi data strobe signal. It comprises a T flip-flop 46, a D flip-flop 47 and a multiplexer 48. The T flip-flop 46 receives a clock signal CLK(2×) with double clock frequency. The signal WIN is input to the terminal TE of the T flip-flop 46. The terminal D of the T flip-flop 46 is connected to ground. A signal DQS_R is output from the terminal Q of the T flip-flop 46. The D flip-flop 47 receives an inverted clock signal with double clock frequency. The signal DQS_R is input to the terminal D of the D. flip-flop 47. A signal DQS_F is output from the terminal Q of the D flip-flop 47. One of the signals DQS_R and DQS_F is transferred to the fine shifter 49 by the multiplexer 48 according to the selection signal DLY_SEL2.

The fine shifter 49 is a multiple stage delay line comprising delay elements with short delay times such as 1/16 period of the clock signal. The delay time of the semi data strobe signal is fine tuned by the fine shifter 49 and then output as the emulated data strobe signal Emulated DQS.

Figure 5:
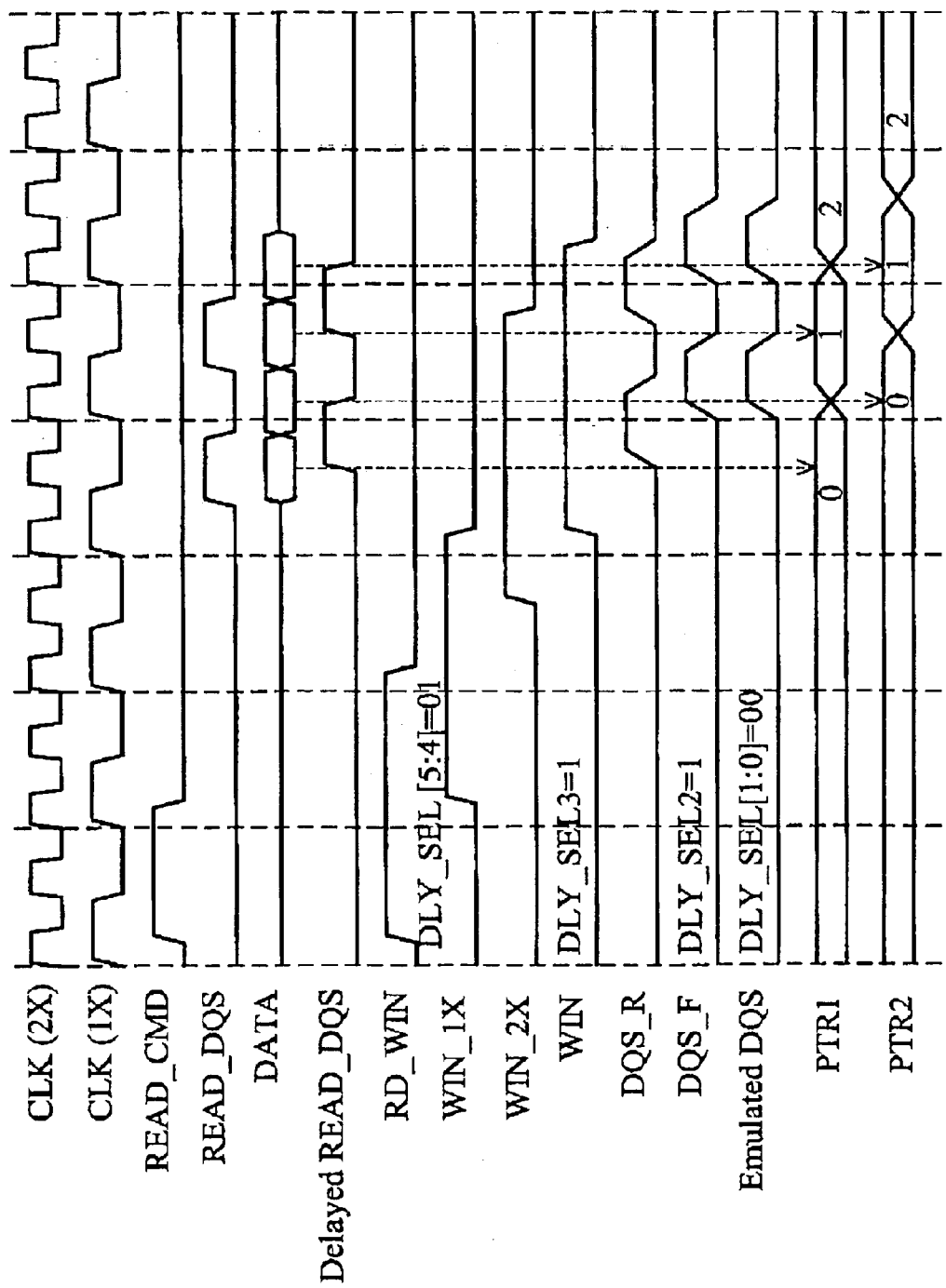
FIG. 5 is a diagram showing waveforms of the signals in the receiver according to one embodiment of the invention.

FIG. 5 is a diagram showing waveforms of the signals in the receiver according to one embodiment of the invention, wherein the selection signals DLY_SEL5, DLY_SEL4, DLY_SEL3 and DLY_SEL2 are "0", "1", "1" and "1".

Figure 6:
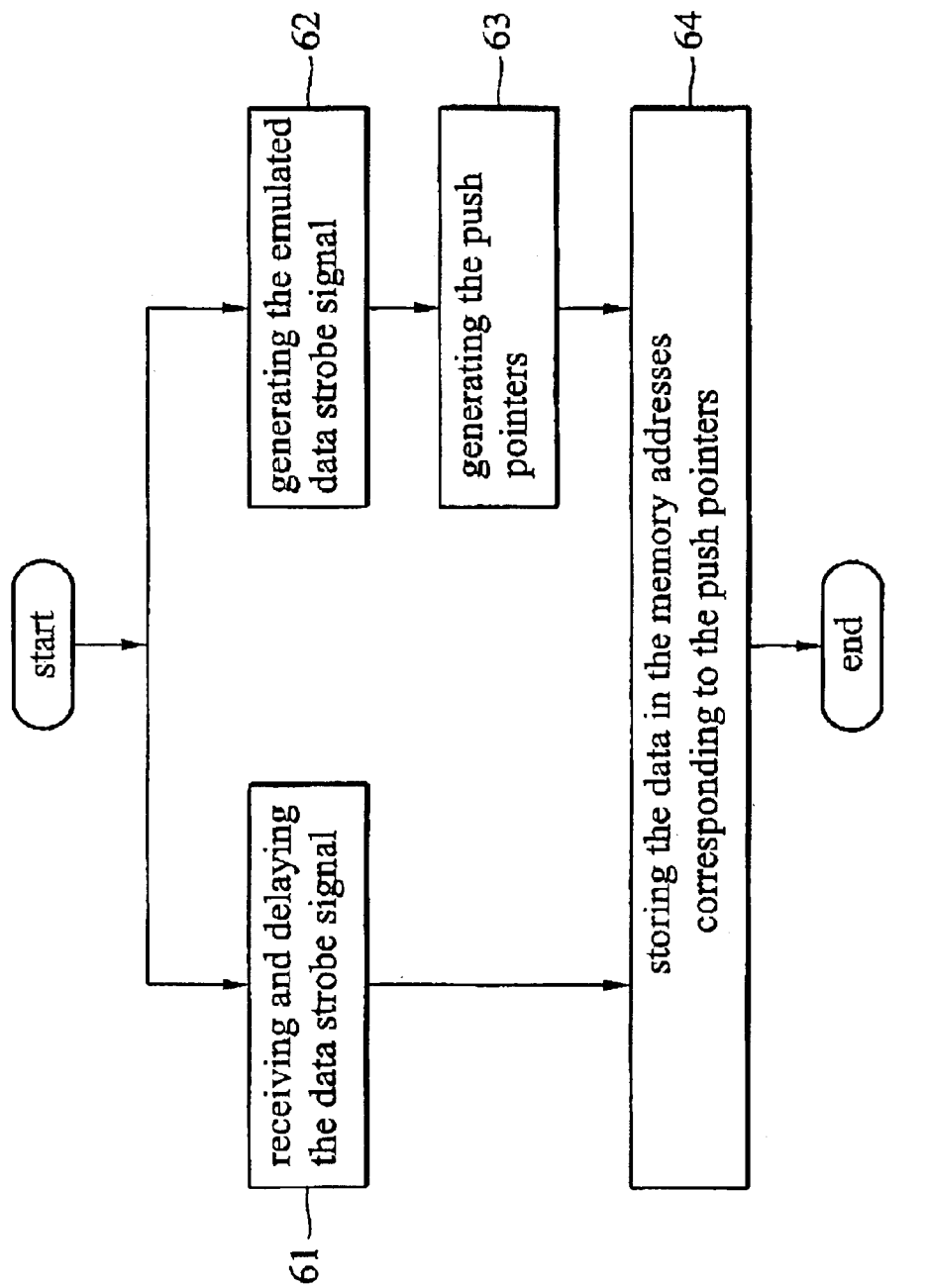
FIG. 6 is a flowchart of a method for data receipt by a memory controller according to one embodiment of the invention.

FIG. 6 is a flowchart of a method for data receipt by a memory controller according to one embodiment of the invention. The memory controller sends a data request signal to a memory which responds to the data request signal by sending data and a data strobe signal back to the memory controller.

In step 61, the data strobe signal is received and delayed.

In step 62, the data request signal is received to generate an emulated data strobe signal.

In step 63, push pointers having priorities are generated. The emulated data strobe signal is received. Responding to the emulated data strobe signal, the push pointers are output in an order according to the priorities upon rising and falling edges of the emulated data strobe signal.

In step 64, the delayed data strobe signal and the push pointers are received. Responding to the delayed data strobe signal and the push pointers, the data is stored in memory addresses corresponding to the push pointers.

In conclusion, the present invention provides a receiver for a memory controller and a method thereof, which substitutes a memory's data strobe signal for a self-generated emulated data strobe signal transformed from the read command signal. The malfunction resulting from the transmission noise of the data strobe signal is avoided by using the self-generated emulated data strobe signal.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A receiver for a memory controller sending a data request signal to a memory which responds to the data request signal by sending data and a data strobe signal back to the memory controller, the receiver comprising:

a delay circuit receiving and delaying the data strobe signal;

an emulated data strobe signal generator receiving the data request signal to generate an emulated data strobe signal;

a push pointer generator generating a plurality of push pointers having priorities, receiving and responding to the emulated data strobe signal by outputting the push pointers in an order according to the priorities; and a buffer receiving and responding to the delayed data strobe signal and the push pointers by storing the data in memory addresses corresponding to the push pointers.

2. The receiver as claimed in claim 1, wherein the push pointer generator comprises a first and second push pointer generator generating a plurality of push pointers having priorities respectively, the buffer comprises a first and second buffer having memory addresses corresponding to the first and second push pointers respectively, the emulated data strobe signal has a plurality of rising and falling edges, the first and second push pointer generator output the first and second push pointers in an order according to the priorities upon the rising and falling edges of the emulated data strobe signal respectively, and the first and second buffer receive and respond to the delayed data strobe signal and the first and second push pointers by alternatively storing the data in the first and second memory addresses corresponding to the first and second push pointers.

3. The receiver as claimed in claim 2 further comprising a data collector collecting the data stored in the first and second buffer.

4. The receiver as claimed in claim 1, wherein the emulated data strobe signal generator comprises:

a read window signal generator receiving the data request signal to generate a read window signal having a first pulse with a duration equal to a read time of the data;

a coarse shifter delaying the read window signal;

a semi data strobe signal generator receiving the delayed read window signal to generate a semi data strobe signal having a second pulse with a duration shorter than the read time of the data; and a fine shifter delaying the semi data strobe signal to generate the emulated data strobe signal.

5. The receiver as claimed in claim 4, wherein the coarse shifter comprises:

a first shifter delaying the read window signal by resolution of a clock period; and a second shifter delaying the read window signal by halves of 1× clock period.

6. A method for data receipt by a memory controller sending a data request signal to a memory which responds to the data request signal by sending data and a data strobe signal back to the memory controller, the method comprising the steps of:

receiving and delaying the data strobe signal;

receiving the data request signal to generate an emulated data strobe signal;

generating a plurality of push pointers having priorities, receiving and responding to the emulated data strobe signal by outputting the push pointers in an order according to the priorities; and receiving and responding to the delayed data strobe signal and the push pointers by storing the data in memory addresses corresponding to the push pointers.

* * * * *